(12) United States Patent
Yin et al.

(10) Patent No.: US 9,614,050 B2
(45) Date of Patent: Apr. 4, 2017

(54) METHOD FOR MANUFACTURING SEMICONDUCTOR DEVICES

(75) Inventors: Haizhou Yin, Poughkeepsie, NY (US); Keke Zhang, Shandong (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/414,355

(22) PCT Filed: Aug. 6, 2012

(86) PCT No.: PCT/CN2012/079717
§ 371 (c)(1),
(2), (4) Date: Jan. 12, 2015

(87) PCT Pub. No.: WO2014/008698
PCT Pub. Date: Jan. 16, 2014

(65) Prior Publication Data
US 2015/0200269 A1    Jul. 16, 2015

(30) Foreign Application Priority Data
Jul. 13, 2012    (CN) .......................... 2012 1 0245140

(51) Int. Cl.
*H01L 21/337*    (2006.01)
*H01L 29/66*    (2006.01)
(Continued)

(52) U.S. Cl.
CPC .. *H01L 29/66492* (2013.01); *H01L 21/76897* (2013.01); *H01L 29/6659* (2013.01); *H01L 29/66583* (2013.01); *H01L 21/28518* (2013.01)

(58) Field of Classification Search
CPC ..................... H01L 23/5226; H01L 29/66545
(Continued)

(56) References Cited

U.S. PATENT DOCUMENTS 6,037,232 A * 3/2000 Wieczorek ........ H01L 21/28052
257/382
6,339,001 B1    1/2002 Bronner et al.
(Continued)

FOREIGN PATENT DOCUMENTS

| CN | 14 77 719 | 2/2004 |
|----|-----------|--------|
| CN | 101 000 925 | 7/2007 |
| CN | 102 38 6217 | 3/2012 |

*Primary Examiner* — Julia Slutsker
(74) *Attorney, Agent, or Firm* — Fay Kaplun & Marcin, LLP

(57) ABSTRACT

The present invention provides a method for manufacturing a semiconductor device, comprising: forming a contact sacrificial pattern on a substrate to cover source and drain regions and expose a gate region; forming an interlayer dielectric layer on the substrate to cover the contact sacrificial pattern and expose the gate region; forming a gate stack structure in the exposed gate region; removing the contact sacrificial pattern to form the source/drain contact trench; and forming a source/drain contact in the source/drain contact trench. By means of a contact sacrificial layer process, the method of manufacturing a semiconductor device according to the present invention effectively reduces the distance between the gate spacer and the contact region and increases the area of the contact region, thus effectively reducing the parasitic resistance of the device.

12 Claims, 5 Drawing Sheets

Figure 1:
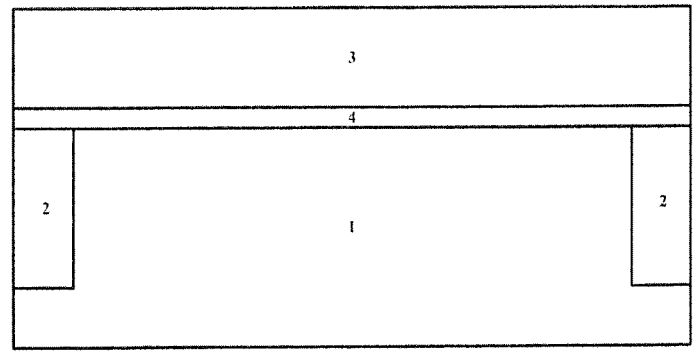

(51) Int. Cl.
*H01L 21/768* (2006.01)
*H01L 21/285* (2006.01)

(58) Field of Classification Search
USPC .................. 438/142, 151, 196, 197, 218
See application file for complete search history.

(56) References Cited

U.S. PATENT DOCUMENTS

| | | | | |
|---|---|---|---|---|
| 6,887,747 | B2* | 5/2005 | Yagishita | H01L 21/28194 |
| | | | | 257/E21.425 |
| 7,608,501 | B2* | 10/2009 | Frohberg | H01L 21/82380 |
| | | | | 257/E21.63 |
| 2011/0281426 | A1* | 11/2011 | Kim | H01L 21/76804 |
| | | | | 438/586 |
| 2012/0104466 | A1* | 5/2012 | Zhu | H01L 23/485 |
| | | | | 257/255 |
| 2012/0119204 | A1* | 5/2012 | Wong | H01L 21/82384 |
| | | | | 257/43 |
| 2013/0161754 | A1* | 6/2013 | Su | H01L 21/82380 |
| | | | | 257/369 |

* cited by examiner

METHOD FOR MANUFACTURING SEMICONDUCTOR DEVICES

CROSS REFERENCE TO RELATED APPLICATION

This application is a national stage application, filed under 35 U.S.C. §371, of PCT Application Serial No. PCT/CN2012/079717 filed on Aug. 6, 2012, entitled "METHOD FOR MANUFACTURING SEMICONDUCTOR DEVICES", which claimed priority to Chinese Patent Application Serial No. 201210245140.6 filed on Jul. 13, 2012; all of the above are hereby incorporated by reference in their entirety.

TECHNICAL FIELD

The present invention relates to the field of manufacturing semiconductor integrated circuits. In particular, the present invention relates to a method of manufacturing MOSFET having an increased contact region.

BACKGROUND ART

As scaling down of the feature size of MOSFETs continuously, the proportion of parasitic resistance in the total resistance of the device is growing, which seriously restricts the enhancement of properties of small size devices. The existing structure/method to reduce parasitic resistance comprises forming raised source/drain, forming a metal silicide in/on the source/drain region, increasing contact area, and so on.

However, no matter which structure/method is used, there is still a large distance between the contact area (or the contact hole, CA) and the gate spacer, and the distance the carriers of electrons/holes span from the source region to the drain region through the channel region is still large. Thus, parasitic resistance still cannot be effectively reduced and the enhancement of the device performance is limited.

SUMMARY OF THE INVENTION

In view of the above, one aspect of the present invention is to provide a new manufacturing method to substitute a contact sacrificial layer process for the traditional replacement gate process, and to reduce the distance between the contact region and the gate significantly, thereby effectively reducing the parasitic resistance of the device.

The above aspect of the present invention is achieved by providing a method of manufacturing a semiconductor device, comprising: forming a contact sacrificial pattern on a substrate to cover source and drain regions and to expose a gate region; forming an interlayer dielectric layer on the substrate to cover the contact sacrificial pattern and expose the gate region; forming a gate stack structure in the exposed gate region; removing the contact sacrificial pattern to form a source/drain contact trench; and forming a source/drain contact in the source/drain contact trench.

The substrate further comprises a shallow trench isolation and the contact sacrificial pattern exposes part of the shallow trench isolation, wherein the interlayer dielectric layer covers part of the shallow trench isolation.

Between forming a contact sacrificial pattern and forming an interlayer dielectric layer, the method further comprises forming a source/drain contact spacer on the side surfaces of the contact sacrificial pattern, wherein the source/drain contact spacer is silicon nitride or silicon oxynitride.

After forming a contact sacrificial pattern, the method further comprises performing ion implantation, forming a lightly doped source/drain extension region and a Halo source/drain doped region in the substrate.

The formation of a gate stack structure comprises depositing a gate insulating layer of a high-k material, a work function adjusting layer of a metal nitride, and a resistance adjusting layer of a metal in the exposed gate region. After forming a gate stack structure, the method further comprises planarizing the resistance adjusting layer, the work function adjusting layer, and the interlayer dielectric layer until the contact sacrificial pattern is exposed.

The steps of forming source/drain contact further comprise: performing source/drain ion implantation to form a source/drain heavily doped region in the substrate exposed in the source/drain contact trench; forming a metal silicide in the source/drain heavily doped region; depositing a liner and a filling layer sequentially on the metal silicide in the source/drain contact trench; and planarizing the filling layer and the liner until the gate stack structure is exposed.

After planarizing the filling layer and the liner, the method further comprises: depositing a second interlayer dielectric layer; etching a second interlayer dielectric layer to form a source/drain contact hole, and forming second source/drain contact by filling the source/drain contact hole; depositing a third interlayer dielectric layer; etching the third interlayer dielectric layer to from interconnecting holes, and forming interconnecting lines in the interconnecting holes.

The step of forming a metal silicide further comprises: depositing a metal layer in the source/drain contact trench, annealing to react the metal layer with silicon in the substrate so as to form a metal silicide, and stripping off the unreacted metal layer.

The contact sacrificial pattern is polycrystalline silicon, amorphous silicon, amorphous carbon, or a combination thereof.

An oxide liner is further provided between the contact sacrificial pattern and the substrate.

The method of manufacturing a semiconductor device according to the present invention effectively reduces the distance between the gate spacer and the contact region via a contact sacrificial layer process and increases the area of the contact region, thus effectively reducing the parasitic resistance of the device.

BRIEF DESCRIPTION OF THE DESCRIPTION

Figure 11:
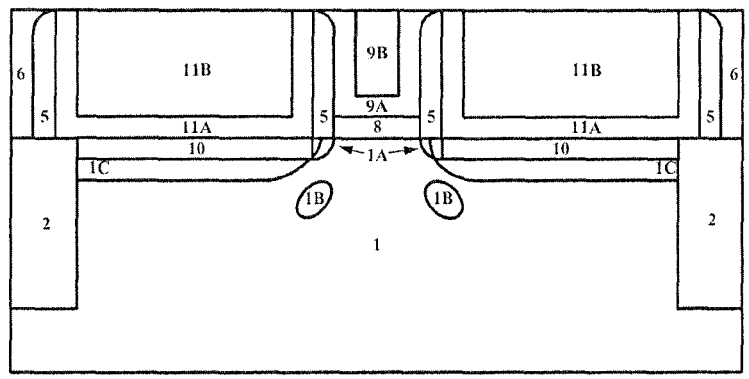
Figure 12:
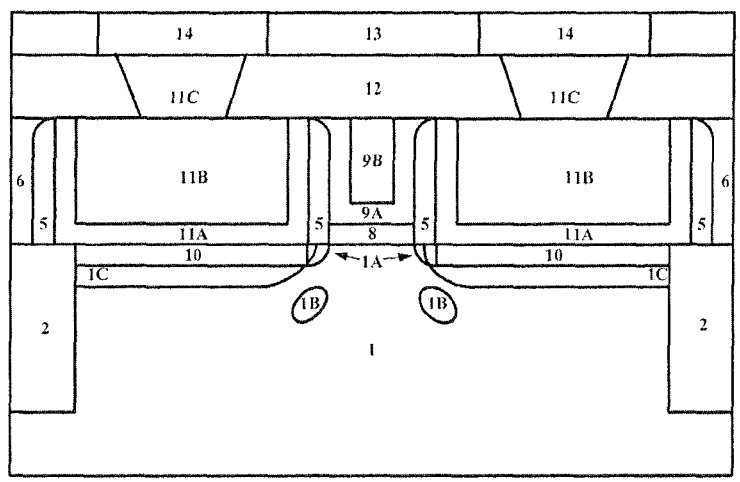
Figure 13:
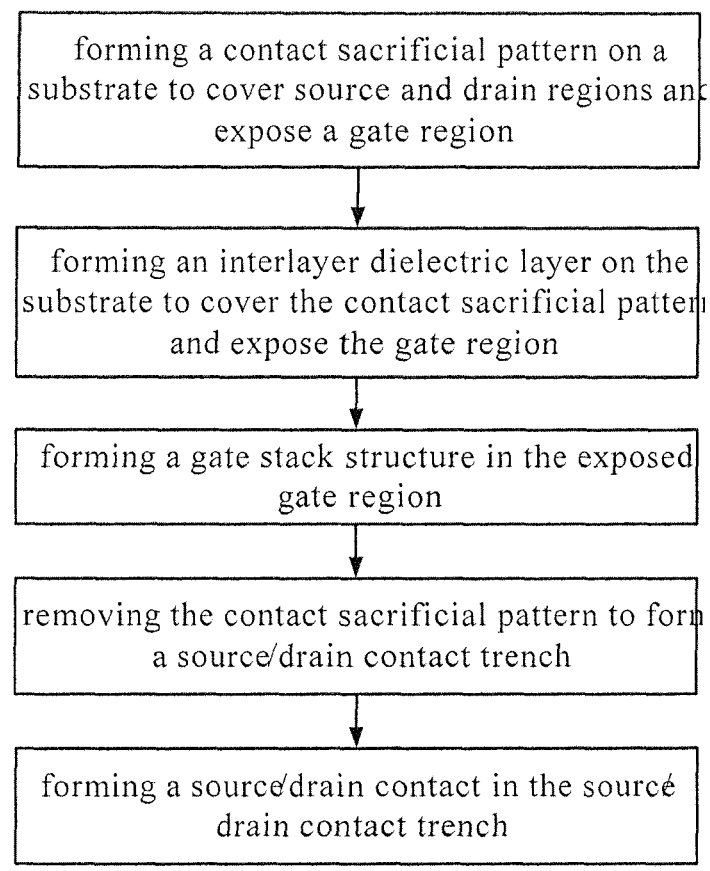

The technical solution of the present invention is described in detail referring to the drawings, wherein:

FIG. 1 to FIG. 12 are sectional views of various steps of a method of manufacturing a semiconductor device according to the present invention; and FIG. 13 is a flowchart of a method of manufacturing a semiconductor device according to the present invention.

DESCRIPTION OF THE PREFERRED EMBODIMENTS

The characteristics and technical effects of the technical solution of the present invention are described in detail referring to the figures in combination with illustrative embodiments. What should be noted is that: similar reference signs denote similar structures, and the terms "first", "second", "above", "below", "thick", "thin", and so on used in the present application can be used for modifying various device structures. These modifications, unless otherwise stated, do not imply the space, order, or hierarchical relationship of the device structure modified.

Referring to FIG. 13 and FIG. 1 to FIG. 3, a contact sacrificial pattern is formed on the substrate, covering the source region and the drain region and exposing the gate region.

As shown in FIG. 1, a contact sacrificial layer 3 is deposited on the substrate 1. The substrate 1 is provided, of which the material may be (bulk) Si (for example, single crystal Si wafer), SOI, single crystal Ge, GeOI (Ge on insulator), or may also be other compound semiconductors, such as GaAs, SiGe, GeSn, InP, InSb, GaN, and so on. Preferably, the substrate 1 is formed by bulk Si or SOI so as to be compatible with the CMOS process. Preferably, a shallow trench is formed by etching in the substrate 1 and an insulating material such as silicon oxide is deposited to fill the shallow trench so as to form a Shallow Trench Isolation (STI)2. The contact sacrificial layer 3 is deposited on the substrate 1 by conventional methods such as LPCVD, PECVD, HDPCVD, MOCVD, MBE, ALD, evaporation, or sputtering. The contact sacrificial layer 3 is used for defining the source/drain contact region to be formed later, which plays a similar role to the dummy gate in the gate-last process, i.e., it may also be referred to as a dummy source/drain contact region. The material of the contact sacrificial layer 3 is, for example, polycrystalline silicon, amorphous silicon, amorphous carbon, etc., having a thickness of, for example, greater than the height of the gate that needs to be formed later, for example, 50 to 500 nm. Preferably, there is further provided a thin oxide liner 4 between the contact sacrificial layer 3 and the substrate 1, and the material of the thin oxide liner 4 may be, for example, silicon oxide, and may have a thickness of, for example, 1 to 10 nm.

Figure 2:
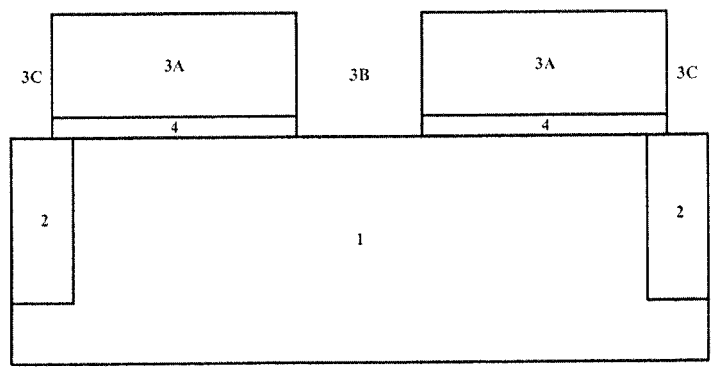

As shown in FIG. 2, the contact sacrificial layer 3 is etched to expose the gate region and part of the STI region. After the mask pattern is formed by photolithography (not shown), anisotropic etching, for example, dry etching such as plasma etching and reactive ion etching or wet etching such as TMAH, is used to etch the contact sacrificial layer 3 and the oxide liner 4 until the substrate is exposed, thus forming a contact sacrificial pattern 3A, wherein the contact sacrificial pattern 3A covers the source/drain region of the device to be formed in the future, while the gate region is exposed through the opening 3B and part of the STI2 region is exposed through the opening 3C. The opening 3B is used for depositing a gate stack structure later and therefore is also referred to as a gate opening (the width of the gate opening should be equal to the sum of the width of the gate stack structure to be formed later and the width of the source/drain contact spacer), and the opening 3C is used for isolation between devices and therefore is also referred to as an isolating opening.

Figure 3:
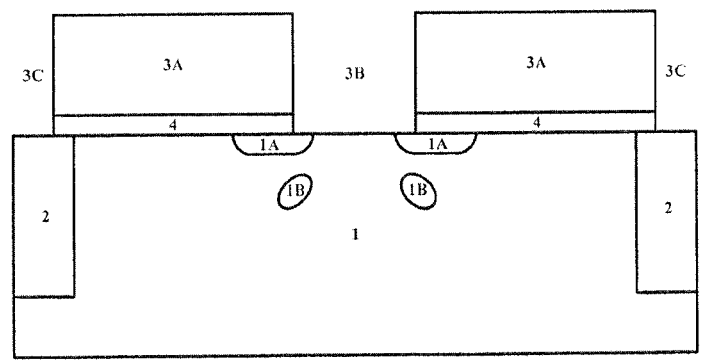

Preferably, as shown in FIG. 3, source/drain doping implantation is performed. With the contact sacrificial pattern 3A as a mask, angled source/drain ion implantation may be performed with low-dose and low energy, and the implanting position of the dopants may be controlled by Shadow Effects, and a lightly-doped source/drain extension region 1A and a Halo source/drain doped region 1B may be formed in the substrate below the source/drain extension 1A. Then, rapid annealing (for example, laser rapid annealing) is performed to activate the dopants. The type, dose and concentration of the doping ions may be configured in accordance with the electrical properties of the device. Alternatively, a spacer containing a diffusion source is formed on both sides of the contact sacrificial layer 3A and the oxide liner 4 (not shown), and a lightly-doped source/drain extension region 1A is formed by ion diffusion.

Figure 4:
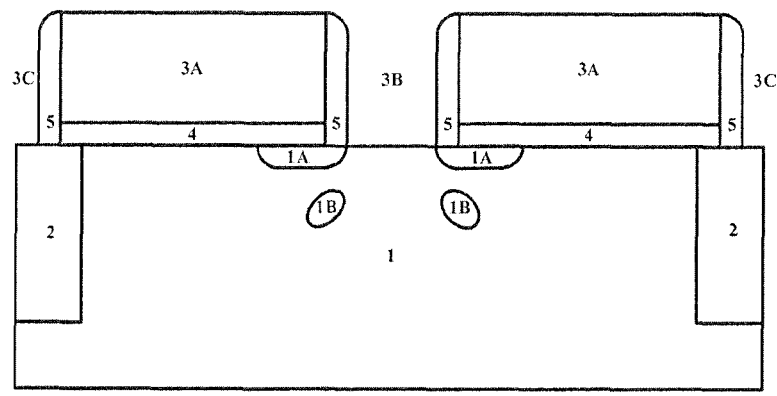

Referring to FIG. 13 and FIG. 4, a source/drain contact spacer is formed on the side surfaces of the contact sacrificial pattern.

As shown in FIG. 4, insulating materials such as silicon nitride and silicon oxynitride are deposited and then etched to form a source/drain contact spacer 5, which is located on the side surfaces of the contact sacrificial pattern 3A. Specifically, the source/drain contact spacer 5 is located on the two side surfaces of the gate opening 3B and on the two side surfaces of the isolating opening 3C. The source/drain contact spacer 5 has a thickness not greater than that of the isolating opening 3C, for example, 5 to 10 nm.

Figure 5:
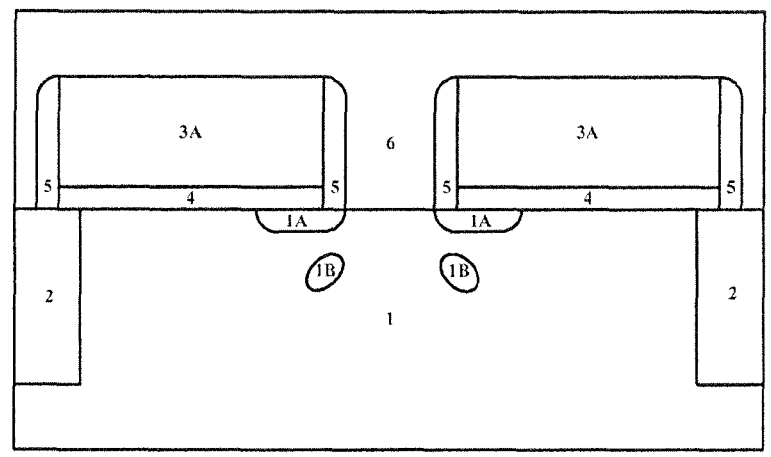
Figure 6:
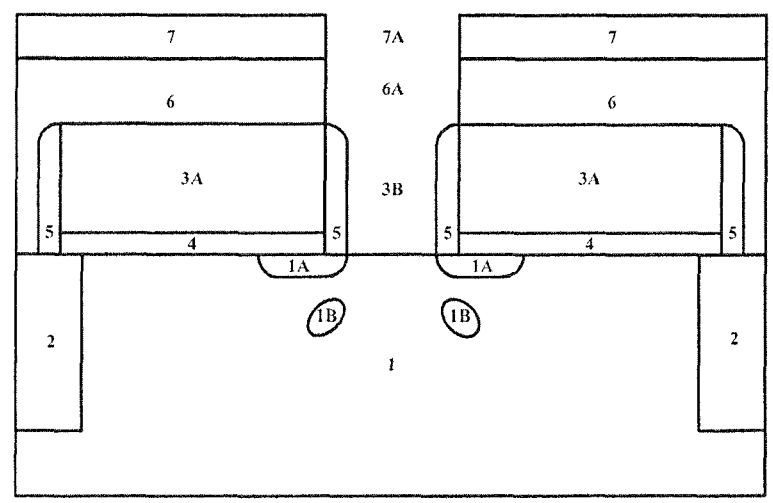

Referring to FIG. 13, FIG. 5 and FIG. 6, an interlayer dielectric layer is formed to cover the contact sacrificial pattern and expose the gate region.

As shown in FIG. 5, an interlayer dielectric layer (ILD) 6 is deposited on the entire device. A Method such as LPCVD, PECVD, spin coating, spray coating, and screen printing may be used to form ILD 6 which is typically of silicon oxide and low-k materials. The low-k materials include, but not limited to, organic low-k materials (e.g., organic polymers containing an aryl group or a polycyclic ring), inorganic low-k materials (e.g., amorphous carbon nitride films, polycrystalline boron-nitrogen films, fluorinated silicate glass, BSG, PSG, and BPSG), and porous low-k materials (e.g., Silsesquioxane (SSQ) based porous low-k materials, porous silica, porous SiOCH, C-doped silica, F-doped porous amorphous carbon, porous diamond, and porous organic polymers). ILD 6 has a thickness greater than that of the contact sacrificial pattern 3A, for example, 100 to 1000 nm.

As shown in FIG. 6, a photoresist layer 7 is spin-coated on ILD 6 and a photoresist layer opening 7A is formed by photolithography to expose ILD 6, followed by selectively etching ILD 6 to form an ILD opening 6A to expose the gate region (the aforementioned gate opening 3B). If ILD 6 is silicon oxide, the source/drain contact spacer 5 is silicon nitride, and the substrate 1 is silicon, then the process parameters such as the type, flow rate and pressure of a carbon-fluorine-based etching gas may be selected so that the rate of etching the silicon oxide is significantly higher than that of etching silicon nitride/silicon, and for example, the etching ratio may be controlled to be above 10:1. The time when the etching may be stopped is controlled by properly selecting the etching rate and time. Or silicon oxide is removed by a HF-based wet etching solution. It should be noted that ILD 6 still covers STI 2 and part of the source/drain contact spacer 5 so as to provide the isolating insulation between devices. At this point, the sidewall of the gate opening 3B has been occupied by part of the source/drain contact spacer 5, wherein the remaining width is the width of the gate stack.

Figure 7:
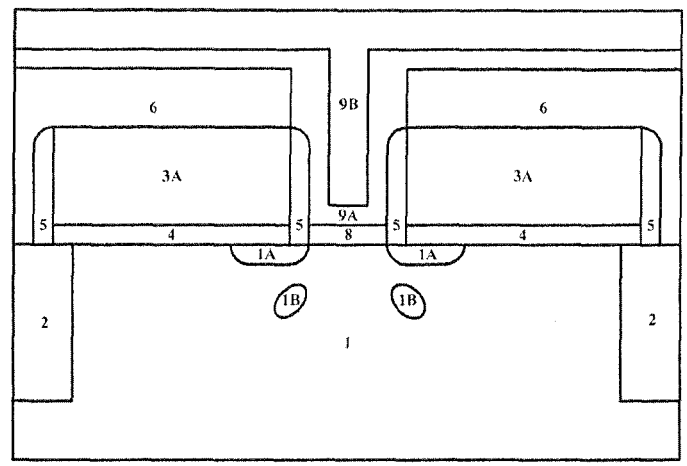
Figure 8:
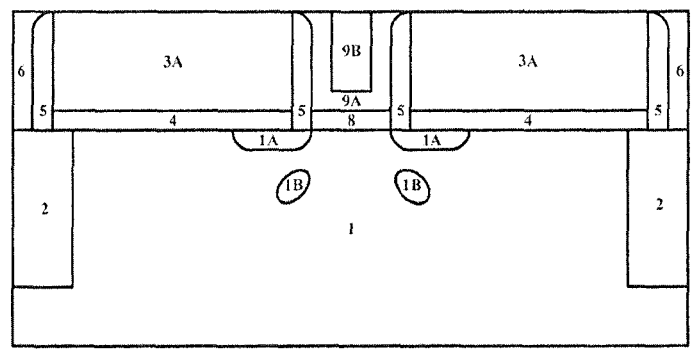

Referring to FIG. 13, FIG. 7 and FIG. 8, a gate stack structure is formed in the exposed gate region.

As shown in FIG. 7, on the surface where the bottom of the gate opening 3B and the substrate 1 contact, a gate insulating layer 8 is deposited by a method such as PECVD, HDPCVD, MOCVD, MBE and ALD. The material of the gate insulating layer 8 is a high-k material, including, but not limited to, nitrides (e.g., SiN, AlN, and TiN), metal oxides (mainly metal oxides of subgroup elements and lanthanides, for example, $Al_2O_3$, $Ta_2O_5$, $TiO_2$, ZnO, $ZrO_2$, $HfO_2$, $CeO_2$, $Y_2O_3$, and $La_2O_3$), perovskite phase oxides, (e.g., $PbZr_xTi_{1-x}O_3$ (PZT) and $Ba_xSR_{1-x}TiO_3$ (BST)). Subsequently, the gate conductive layer 9 is deposited on ILD 6 and in the gate opening 3B by a method such as PECVD, MOCVD, MBE, ALD, evaporation, and sputtering. The gate conductive layer 9 preferably comprises a work function adjusting layer of metal nitrides such as TiN and TaN, and a resistance adjusting layer of metals such as Cu, Al, Ti, Mo, Ta or W. The gate insulating layer 8 and the gate conductive layer 9 together constitute a gate stack structure.

Preferably, as shown in FIG. 8, the gate conductive layer 9 and ILD 6 may be planarized by a etching back process or a CMP process to expose the contact sacrificial pattern 3A.

Figure 9:
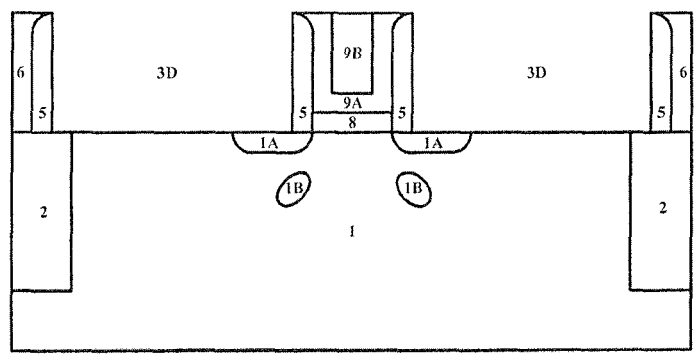

Referring to FIG. 13 and FIG. 9, the contact sacrificial pattern is removed to form the source/drain contact trench. For example, an anisotropic wet etching solution such as TMAH is used to remove the contact sacrificial pattern 3A of polysilicon or amorphous silicon material by etching, or the contact sacrificial pattern 3A of an amorphous carbon material is removed by oxygen plasma etching. Subsequently, the oxide liner 4 of a silicon oxide material is removed by a HF-based etching solution. Thus, after the contact sacrificial pattern is removed, the source/drain contact trench 3D is left (where the source/drain contact trench 3D was occupied by the previous contact sacrificial pattern 3A), and the substrate 1A, source/drain extension region 1A, part of STI 2, and source/drain contact spacer 5 are exposed.

Referring to FIG. 13 and FIGS. 10 to 12, a source/drain contact is formed in the source/drain contact trench.

Figure 10:
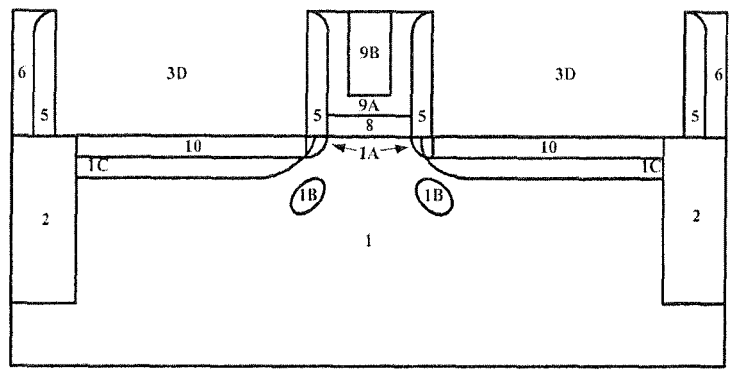

As shown in FIG. 10, preferably, source/drain implantation is performed to form a source/drain heavily doped region 1D, and the type of the implanted ions are the same as that of the source/drain extension region 1A formed by light-doping implantation but different from that of the Halo source/drain doped region 1B. However, due to the greater implantation dose and energy, the source/drain heavily doped region 1C with greater junction depth and concentration will be obtained. Alternatively, a raised source/drain (not shown) is formed in the source/drain contact trench 3D and on the substrate 1 by a selective epitaxial process. In-situ doping is also performed while forming a source/drain extension region, or implantation doping and annealing activation are implemented after forming a source/drain extension region.

A thin layer (not shown) of metal, for example, Ni, Pt, Co, Ti, and combinations thereof, is formed in the source/drain contact trench 3D by sputtering and evaporation, and then rapid annealing or low temperature annealing (400 to 600° C.) is performed to form the metal silicide 10 from the reaction of the metal thin layer with Si in the substrate 1 and the source/drain region for further reducing contact resistance. The unreacted metal thin layer is stripped off. At this time, since STI 2 of an oxide material and the source/drain contact spacer 5 of a silicon nitride material do not react with the metal thin layer, the metal silicide 10 is only formed in the substrate 1 (source/drain heavily doped region 1C).

As shown in FIG. 11, a barrier layer 11A (liner) of materials Ti and TaN and a filling layer 11B of materials such as W, Al, Mo and Ti are sequentially deposited on the metal silicide 10 in the source/drain contact trench 3D to form a source/drain contact 11. Preferably, a process such as CMP is used to planarize the barrier layer 11A/the filling layer 11B until the gate conductive layer 9 (resistance adjusting layer 9B) in the gate stack structure is exposed. At this time, the distance between the source/drain contact 11 and the gate stack structure is only the thickness of the source/drain contact spacer 5, which is significantly reduced. In addition, the source/drain contact 11 covers the entire source/drain region, and thus has a significantly larger area compared with the existing technology. Therefore, such a source/drain contact of a large area in accordance with the present invention effectively reduces parasitic resistance.

As shown in FIG. 12, the subsequent processes are completed. For example, a second ILD 12 of a material such as silicon nitride is deposited on the entire device. ILD 12 is etched to form a source/drain contact hole. The source/drain contact hole is filled with metal materials to form a second source/drain contact 11C. A third ILD 13 of a material such as silicon oxide is deposited on the entire device and is etched to form interconnecting holes, and metals such as Al and Ti are deposited in the interconnecting holes to form an interconnecting line 14.

By means of a contact sacrificial layer process, the method of manufacturing a semiconductor device in accordance with the present invention effectively reduces the distance between the gate spacer and the contact region and increases the area of the contact region, thus effectively reducing the parasitic resistance of the device.

Although the present invention is described with reference to one or more exemplary embodiments, those skilled in the art know that a variety of suitable alternations and equivalents can be made to the method of forming a device structure without departing from the scope of the present invention. Furthermore, from the teachings disclosed, many amendments suitable for specific situations or materials can be made without departing from the scope of the invention. Accordingly, the object of the present invention is not limited to particular embodiments used for achieving the best modes to carry out the present invention, while the device structure and its manufacturing method disclosed will include all embodiments that fall within the scope of the invention.

We claim:

1. A method for manufacturing a semiconductor device, comprising:
    forming a contact sacrificial pattern on a substrate to cover source and drain regions and part of a Shallow Trench Isolation ("STI") region and expose a gate region;
    forming a source/drain contact spacer on side surfaces of the contract sacrificial pattern;
    forming an interlayer dielectric layer on the substrate to cover the contact sacrificial pattern and expose the gate region;
    forming a gate stack structure in the exposed gate region;
    removing the entire contact sacrificial pattern by anisotropic wet etching to form a source/drain contact trench; and
    forming a source/drain contact in the source/drain contact trench.

2. The method for manufacturing a semiconductor device according to claim 1, wherein the substrate further comprises shallow trench isolation, and the contact sacrificial pattern exposes part of the shallow trench isolation.

3. The method for manufacturing a semiconductor device according to claim 2, wherein the interlayer dielectric layer covers part of the shallow trench isolation.

4. The method for manufacturing a semiconductor device according to claim 1, wherein the source/drain contact spacer is of silicon nitride or silicon oxynitride.

5. The method for manufacturing a semiconductor device according to claim 1, wherein after forming the contact sacrificial pattern, the method further comprises forming a lightly-doped source/drain extension region and a Halo source/drain doped region in the substrate.

6. The method for manufacturing a semiconductor device according to claim 1, wherein the formation of a gate stack structure comprises depositing a gate insulating layer of a high-k material, a work function adjusting layer of a metal nitride, and a resistance adjusting layer of a metal in the exposed gate region.

7. The method for manufacturing a semiconductor device according to claim 6, wherein after forming the gate stack structure, the method further comprises planarizing the resistance adjusting layer, the work function adjusting layer, and the interlayer dielectric layer until the contact sacrificial pattern is exposed.

8. The method for manufacturing a semiconductor device according to claim 1, wherein the method of forming a source/drain contact further comprises:
    forming a source/drain heavily doped region in the exposed substrate in the source/drain contact trench;
    forming a metal silicide in the source/drain heavily doped region;
    depositing a liner and a filling layer sequentially on the metal silicide in the source/drain contact trench; and
    planarizing the filling layer and the liner until the gate stack structure is exposed.

9. The method for manufacturing a semiconductor device according to claim 8, wherein after planarizing the filling layer and the liner, the method further comprises: depositing a second interlayer dielectric layer; etching the second interlayer dielectric layer to form a source/drain contact hole and filling the source/drain contact hole to form a second source/drain contact; depositing a third interlayer dielectric layer; and etching the third interlayer dielectric layer to form interconnecting holes, and forming interconnecting lines in the interconnecting holes.

10. The method for manufacturing a semiconductor device according to claim 8, wherein the method of forming a metal silicide further comprises: depositing a metal layer in the source/drain contact trench, performing annealing so that the metal layer react with silicon in the substrate so as to form a metal silicide, and stripping off the unreacted metal layer.

11. The method for manufacturing a semiconductor device according to claim 1, wherein the contact sacrificial pattern is of polycrystalline silicon, amorphous silicon, amorphous carbon, or any combination thereof.

12. The method for manufacturing a semiconductor device according to claim 1, wherein an oxide liner is further provided between the contact sacrificial pattern and the substrate.

* * * * *